United States Patent [19]

DiFranco et al.

[11] Patent Number: 5,431,803
[45] Date of Patent: Jul. 11, 1995

[54] ELECTRODEPOSITED COPPER FOIL AND PROCESS FOR MAKING SAME

[75] Inventors: Dino F. DiFranco, Mayfield Village; Shiuh-kao Chiang, Solon; Craig J. Hasegawa, Willoughby, all of Ohio

[73] Assignee: Gould Electronics Inc., Eastlake, Ohio

[21] Appl. No.: 141,483

[22] Filed: Oct. 22, 1993

Related U.S. Application Data

[63] Continuation-in-part of Ser. No. 865,791, Apr. 7, 1992, which is a continuation of Ser. No. 531,452, May 30, 1990, abandoned.

[51] Int. Cl.$^6$ .............................................. C25D 1/04
[52] U.S. Cl. ..................................... 205/50; 205/101; 205/148; 205/170; 205/77; 428/544; 428/606
[58] Field of Search ................... 205/50, 77, 148, 170, 205/101; 428/544, 606

[56] References Cited

U.S. PATENT DOCUMENTS

| | | | |
|---|---|---|---|
| 2,475,974 | 7/1949 | Max | 204/52 |
| 2,482,354 | 9/1949 | Max et al. | 204/52 |
| 2,563,360 | 8/1951 | Phillips et al. | 204/52 |
| 2,859,159 | 11/1958 | Wernlund | 204/44 |
| 2,876,178 | 3/1959 | McCoy | 204/52 |
| 3,864,227 | 2/1975 | Brytczuk et al. | 204/108 |
| 4,082,591 | 4/1978 | Morisaki et al. | 156/150 |
| 4,088,544 | 5/1978 | Huttkin | 204/12 |
| 4,169,018 | 9/1979 | Berdan et al. | 204/13 |
| 4,386,139 | 5/1983 | Nakatsugawa | 428/607 |
| 4,387,006 | 6/1983 | Kajiwara et al. | 204/32 R |
| 4,686,017 | 8/1987 | Young | 204/45.1 |
| 4,834,842 | 5/1989 | Langner et al. | 204/1 T |
| 4,956,053 | 9/1990 | Polan et al. | 204/13 |
| 4,976,826 | 12/1990 | Tani et al. | 204/12 |
| 5,049,221 | 9/1991 | Wada et al. | 156/151 |
| 5,181,770 | 1/1993 | Brock et al. | 205/77 |

FOREIGN PATENT DOCUMENTS

| | | |
|---|---|---|
| 0207244 | 1/1987 | European Pat. Off. |
| 0250195 | 12/1987 | European Pat. Off. |
| 52-33074 | 3/1977 | Japan |
| 54-38053 | 11/1979 | Japan |
| 61-52387 | 3/1986 | Japan |
| 63-310989 | 6/1987 | Japan |
| 62-146986 | 12/1988 | Japan |
| 63-310990 | 12/1988 | Japan |
| 2182890 | 7/1990 | Japan |
| 432155 | 5/1992 | Japan |
| WO9119024 | 12/1991 | WIPO |

OTHER PUBLICATIONS

Wen, C. Y. et al., "The Effect of Organic and Inorganic 'Addition Agents' Upon the Electrodeposition of Copper From Electrolytes Containing Arsenic," Advance copy from the General Meeting of the American Electrochemical Society, Sep. 21–23, 1911.

Search Report for European Appl. 91911599.8, mailed Feb. 9, 1993.

(List continued on next page.)

Primary Examiner—John Niebling
Assistant Examiner—Kishor Mayekar
Attorney, Agent, or Firm—Michael A. Centanni

[57] ABSTRACT

This invention is directed to a controlled low profile electrodeposited copper foil. In one embodiment this foil has a substantially uniform randomly oriented grain structure that is essentially columnar grain free and twin boundary free and has an average grain size of up to about 10 microns. In one embodiment this foil has an ultimate tensile strength measured at 23° C. in the range of about 87,000 to about 120,000 psi and an elongation measured at 180° C. of about 15% to about 28%. The invention is also directed to a process for making the foregoing foil, the process comprising: (A) flowing an electrolyte solution between an anode and a cathode and applying an effective amount of voltage across said anode and said cathode to deposit copper on said cathode; said electrolyte solution comprising copper ions, sulfate ions and at least one organic additive or derivative thereof, the chloride ion concentration of said solution being up to about 1 ppm; the current density being in the range of about 0.1 to about 5 A/cm$^2$; and (B) removing copper foil from said cathode.

44 Claims, 7 Drawing Sheets

OTHER PUBLICATIONS

Chem. Abstract, 105:14254j, Masataka et al., "Manufacture of Electrolytic Copper Foils for Printed Circuits Having Good Elongation . . . " (1986).

Kuwako et al., "A New Very Low Profile Electrodeposited Copper Foil", No. B 8/1, Technical Paper, Jun. 1990.

Anderson et al., "Tensile Properties of Acid Copper Electrodeposits", Journal of Applied Chemistry 15(1985) 631–637.

Bucci et al., "Copper Foil Technology", PC Fab Jul. 1986, pp. 22–33.

Lakshmanan et al., "The Effect of Chloride Ion in the Electrowinning of Copper", Journal of Applied Electrochemistry 7 (1977) 81–90.

Lamb et al., "Physical & Mechanical Properties of Electrodeposited Copper", Journal of Electrochemical Society, Sep. 1970, pp. 291C–318C.

Lamb et al., "Physical & Mechanical Properties of Electrodeposited Copper", AES Research Project No. 21, pp. 86–95, Jan. 1966.

Lamb et al., "Physical & Mechanical Properties of Electrodeposited Copper", AES Research Project No. 21, pp. 1289–1311, Dec. 1965.

Fedot'ev et al., "Limit of Strength & Microhardness of Electrolytic Copper", vol. 37, No. 3 pp. 691–693, Mar. 1964, Lensovet Leningrad Technological Institute.

Lyde, "Copper Pyrophosphate Plating", Metal Industry, London, 101, 82 (1962).

Heusner et al., "Some Metallurgical Aspects of Electrodeposits", Plating, 35, 554, 719 (1948), pp. 554–577.

Jernstedt, "Brighter Finishes via PR Plating", Westinghouse Engr., 10, No. 3, 139 (1943).

Bennett et al., "Tensile Strength of Electrolyte Copper on a Rotating Cathode", Trans. Am. Electrochem. Soc. 21, 253 (1912), pp. 253–274.

Lowenheim, "Modern Electroplating", Electrochemical Society, 1974, John Wiley & Sons, pp. 196–197.

Jernstedt, "Leveling with PR Current Plating", Proc. Am. Electroplater's Soc., 37, 151 (1950).

ELECTRODEPOSITED COPPER FOIL AND PROCESS FOR MAKING SAME

This application is a continuation-in-part of U.S. application Ser. No. 07/865,791, filed Apr. 7, 1992, which is a continuation of U.S. application Ser. No. 07/531,452, filed May 30, 1990 (now abandoned). The disclosures of these prior applications are incorporated herein by reference in their entireties.

TECHNICAL FIELD

This invention relates to electrodeposited copper foils which are useful in making printed circuit boards (PCBs), and to a process for making such foils.

BACKGROUND OF THE INVENTION

The production of copper foil by electrodeposition involves the use of an electroforming cell containing an anode, a cathode, an electrolyte solution and a source of current. The cathode is cylindrical in shape and the anode conforms to the curvature of the cathode to maintain a constant separation between the two. The electrolyte solution, which contains copper ions and sulfate ions, flows between the anode and the cathode. Voltage is applied between the anode and the cathode and copper deposits on the cathode. The copper feed stock, which is typically copper shot, copper wire or recycled copper, is dissolved in sulfuric acid to form the electrolyte solution. Various types of agents such as animal glue, thiourea and chloride ions are typically added to the electrolyte solution to control the foil properties.

Electrodeposited copper foil is supplied to PCB manufacturers in the form of laminates. These laminates are formed by bonding the copper foil to a polymeric insulating resin. The copper foil portion of the laminate is etched to form the conductive paths of the PCB using processes known to those skilled in the art. The etched copper conductive paths provide electrical connection between various portions of an electronic device.

To be acceptable for PCB applications, it is desirable that copper foils have controlled low profiles to provide etchability and impedance control. It is preferred that these foils have high ultimate tensile strengths (UTS) to provide desired handling and surface quality characteristics, and high elongations at elevated temperatures to resist cracking. Foils having high profiles result in laminates that exhibit measles and embedded copper. Foils having profiles that are too low result in laminates with insufficient bond strength. Foils with low elongations at elevated temperatures crack when temperature stressed. Foils with low UTS's wrinkle during handling.

The prior art suggests copper foils having many of these attributes, but there is a continuing demand for higher quality copper foils. By virtue of the inventive process, which involves the use of electrolyte solutions employing organic additives and critical concentrations of chloride ions below about 1 ppm, higher quality copper foils of the type that are acceptable for PCB applications are achieved.

Lakshmanan et al, "The Effect of Chloride Ion in the Electrowinning of Copper", Journal of Applied Electrochemistry 7 (1977) 81–90, discloses that the effect of chloride ion concentration on copper electrodeposition is dependent on the operating current density. At lower current density values the ridge type growth structure orientation is favored for additive-free electrolytes. At high current density values pyramidal growth orientation is favored for additive-free electrolytes. The addition of chloride ion to the 10 ppm level lowers the overvoltage and thus promotes ridge type oriented deposits. As the current density is increased to 40 amps per square foot [0.043 A/cm$^2$], the pyramidal growth structure is again favored. The article indicates that the current densities that were tested ranged from 15 to 40 amps per square foot [0.016 to 0.043 A/cm$^2$].

Anderson et at, "Tensile Properties of Acid Copper Electrodeposits", Journal of Applied Electrochemistry, 15 (1985) 631–637, discloses that the chloride ion concentration in an acid copper plating bath influences the ultimate tensile strength and elongation of the foil produced therefrom. The article indicates that at the current densities tested, acid copper plating baths require the presence of chloride ions to provide a ductile copper deposit. The current densities reported in the article ranged from 20 to 50 mA/cm$^2$ [0.02 to 0.05 A/cm$^2$]. Chloride ion concentrations in the range of 0 to 100 ppm are reported.

Kuwako et at, "A New Very Low Profile Electrodeposited Copper Foil," Printed Circuit World Convention 5, Technical Paper No. B 8/1, (1990), discloses an electrodeposited copper foil having a fine grain size, very low profile, high elongation at elevated temperature and high tensile strength over a wide temperature range. The reference indicates that this foil exhibits tensile strengths ranging from about 60 Kg/mm$^2$ (85,320 psi) at about −50° C. to 0° C. to about 20 Kg/mm$^2$ (28,440 psi) at about 200° C. The elongation ranges from about 6% to about 10% over a temperature range of about −50° C. to about 290° C.

U.S. Pat. No. 2,475,974 discloses a process for making copper deposits having tensile strengths of about 60,000 to about 73,000 psi and elongations of 6% to 9% using a copper plating solution containing triethanolamine.

U.S. Pat. No. 2,482,354 discloses a process for making copper deposits having tensile strengths of about 65,000 to about 90,000 psi and elongations of 8% to 12% using a copper plating solution containing tri-isopropanolamine.

U.S. Pat. No. 4,956,053 discloses a process and apparatus for producing metal foil which comprises supplying an isotopically polished continuous cathode, a high volume turbulent flow of electrolyte and rigorous filtration to exclude chlorides, sulfides, organics and other impurities from the electrolyte. The foil so produced is free from micro-voids and able to withstand substantially higher biaxial stresses than conventional electrodeposited foil. The micro void free structure also decreases the diffusion ram of an underlying substrate.

U.S. Pat. No. 5,181,770 discloses an electrodeposition process for making copper foil using an electrolyte solution having a chloride ion concentration of either 0.5–2.5 ppm or 10–50 ppm. The reference indicates that all organic and inorganic additives as well as impurities are excluded from the electrolyte.

WO 91/19024 discloses electrodeposited copper foils having an elongation measured at 180° C. in excess of about 5.5%, an ultimate tensile strength measured at 23° C. in excess of about 60,000 psi, and a matte-side R$_{tm}$ in the range of about 4.5 to about 18 μm. This reference also discloses a process for making electrodeposited copper foil which comprises: preparing a copper deposition bath comprising water, copper ions and sulfate ions, said bath containing less than about 20 ppm chloride ions; and applying electric current to said bath to electrodeposit copper from said bath using a current density in the range of about 200 to about 3000 amps per square foot [0.22-3.23 A/cm²].

SUMMARY OF THE INVENTION

This invention is directed to a controlled low profile electrodeposited copper foil. In one embodiment this foil has a substantially uniform randomly oriented grain structure that is essentially columnar grain free and twin boundary free and has an average grain size of up to about 10 microns. In one embodiment this foil has an ultimate tensile strength measured at 23° C. in the range of about 87,000 to about 120,000 psi and an elongation measured at 180° C. of about 15% to about 28%. The invention is also directed to a process for making the foregoing foil, the process comprising: (A) flowing an electrolyte solution between an anode and a cathode and applying an effective amount of voltage across said anode and said cathode to deposit copper on said cathode; said electrolyte solution comprising copper ions, sulfate ions and at least one organic additive or derivative thereof, the chloride ion concentration of said solution being up to about 1 ppm; the current density being in the range of about 0.1 to about 5 A/cm²; and (B) removing copper foil from said cathode.

DESCRIPTION OF THE PREFERRED EMBODIMENTS

Figure 1:
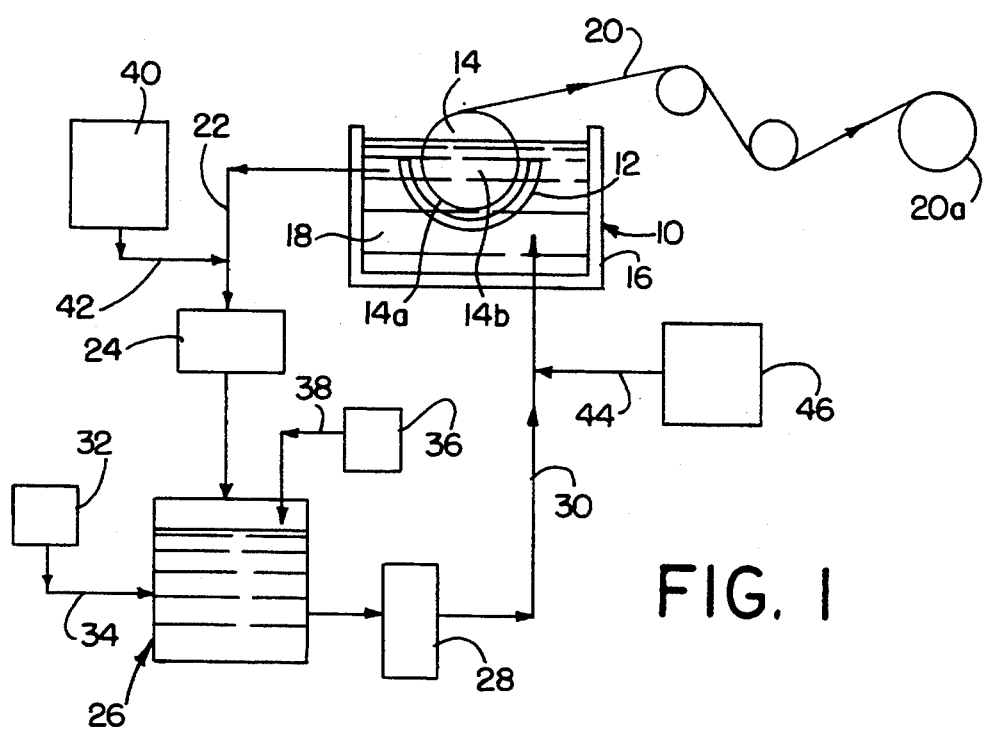
FIG. 1 is a flow sheet illustrating the process of the invention in one embodiment.

The inventive copper foils are controlled low profile electrodeposited copper foils that exhibit a unique and novel combination of characteristics. The low controlled profiles for these foils provide enhanced etchability and impedance control. In one embodiment the inventive foils have substantially uniform randomly oriented grain structures that are essentially columnar grain free and twin boundary free and have average grain sizes of up to about 10 microns. In one embodiment the inventive foils have high UTS's for ease of handling and surface quality control and high elongations at elevated temperatures for reduced cracking. In various embodiments, the inventive foils are porosity free, exhibit improved thermal stability to resist recrystallization, have higher degrees of hardness for improved processing (e.g., slitting, drilling, etc.), and exhibit a combination of IPC (Institute for Interconnecting and Packaging Electronic Circuits) Class 1 and Class 3 properties in one foil to reduce inventory requirements. The inventive foil is achieved by virtue of the inventive process for making the foil which involves the use of electrolyte solutions employing organic additives and critical concentrations of chloride ions at levels of less than about 1 ppm.

In one embodiment the inventive copper foils are characterized by a substantially uniform randomly oriented grain structure that is essentially columnar grain free and twin boundary free. The expression "essentially columnar grain free and twin boundary free" refers to the fact that in most instances microscopic or TEM analysis of the inventive foils will demonstrate that such foils are columnar grain free and twin boundary free, but that on occasion minor amounts of columnar grain formation and/or twin boundary formation may be observed. In one embodiment the inventive foils are porosity free. The average grain size for the inventive foil is preferably up to about 10 microns, more preferably up to about 5 microns, more preferably up to about 2 microns. In one embodiment the average grain size is in the range of up to about 1 micron, and in another embodiment in the range of about 0.05 to about 1 micron, and in another embodiment about 0.05 to about 0.8 micron, and in another embodiment about 0.1 to about 0.5 micron, and in still another embodiment about 0.2 to about 0.4 micron.

In one embodiment, the UTS for the inventive copper foils at 23° C. is preferably in the range of about 87,000 psi to about 120,000 psi, more preferably about 90,000 psi to about 120,000 psi, more preferably about 92,000 psi to about 120,000 psi, more preferably about 95,000 to about 120,000 psi, and in one embodiment about 95,000 psi to about 110,000 psi, and in another embodiment about 95,000 psi to about 105,000 psi, and in another embodiment about 95,000 psi to about 100,000 psi, using Test Method 2.4.18 of IPC-TM-650. In one embodiment, the UTS for these foils at 180° C. is preferably in range of about 25,000 psi to about 35,000 psi, and in one embodiment about 27,000 psi to about 31,000 psi, using the foregoing test method.

In one embodiment, the elongations for these foils at 23° C. are preferably about 4% to about 12%, and in one embodiment about 7% to about 9%, using Test Method 2.4.18 of IPC-TM-650. In one embodiment, the elongations for these foils at 180° C. are preferably about 15% to about 28%, and in one embodiment about 18% to about 28%, and in another embodiment about 18% to about 25%, and in another embodiment about 21% to about 25%, using the foregoing test method.

The mechanical properties for the inventive foils exceed the minimum requirements specified by the IPC in IPC-CF-150E for both Class 1 and Class 3 electrodeposited copper foils. Thus, the inventive foils are classified as both Class 1 and Class 3 foils.

The term "thermal stability" is used herein to refer to the change in UTS at 23° C. after heating the foil sample at 200° C. for 30 minutes in an oil bath. The thermal stability for these foils is preferably less than about 15%, and in one embodiment less than about 10%. That is, a thermally stable foil within the scope of the invention undergoes a decrease in UTS at 23° C. of preferably less than about 15%, and in one embodiment less than about 10%, when compared to the UTS for that foil prior to heating the sample.

The Knoop Hardness Number (KHN) for the inventive copper foils at 23° C. is preferably in the range from about 160 to about 240, and in one embodiment from about 200 to about 230, using ASTM Test Method E384-89.

The inventive copper foils preferably have a matte-side raw foil roughnesses, $R_{tm}$, of about 1 to about 10 microns, and in one embodiment from about 2 to about 8 microns, and in another embodiment from about 3 to about 6 microns. $R_{tm}$ is the mean of the maximum peak-to-valley vertical extent from each of five consecutive sampling lengths, and can be measured using a Surftronic 3 profilometer marketed by Rank Taylor Hobson, Ltd., Leicester, England.

The $R_{tm}$ for the shiny side of these foils is preferably less than about 6 microns, more preferably less than about 5 microns, and is preferably in the range of about 2 to about 6 microns, more preferably in the range of about 2 to about 5 microns.

The weights for these copper foils preferably range from about ⅛ to about 14 ounces per square foot, more preferably about ¼ to about 6 ounces per square foot, more preferably about ½ to about 2 ounces per square foot. In one embodiment, these foils have weights of about ½, 1 or 2 ounces per square foot. A foil having a weight of ½ ounce per square foot has a nominal thickness of about 17 microns. A foil having a weight of 1 ounce per square foot has a nominal thickness of about 35 microns. A foil having a weight of 2 ounces per square foot has a nominal thickness of about 70 microns. The $R_{tm}$ for the thinner foils tend to be lower than for the thicker foils. Thus, for example, foils having weights of one-half ounce per square foot, have, in one embodiment, a matte side raw foil $R_{tm}$ in the range of about 1 to about 4 microns, while foils having weights of 2 ounces per square foot have, in one embodiment, a matte side raw foil. $R_{tm}$ in the range of about 5 to about 7 microns.

Advantages realized by the metallurgical and physical property improvements provided by various embodiments of the invention are summarized below.

| Metallurgical/Physical Property Improvements | Advantages |
| --- | --- |
| (1) Higher UTS | (1) (a) Fewer wrinkles of thin foils<br>(b) Improved stiffness and handleability<br>(c) Improved surface quality of laminate |
| (2) Smaller, more uniform grain size and lower profile | (2) (a) No porosity<br>(b) Improved etchability<br>(c) Better impedance control<br>(d) Dielectric thickness control<br>(e) Fewer lamination voids<br>(f) Reduced measles width 2 oz. foil<br>(g) Fewer white spots after etching<br>(h) Improved dimensional stability |
| (3) Higher elongation at 180° C. | (3) (a) Resistant to stress cracking in multilayer boards |
| (4) Thermal stability | (4) (a) Resists copper recrystallization<br>(b) Less warp and twist |
| (5) Greater hardness | (5) (a) Improved slitting and drilling |
| (6) IPC Class 1 and Class 3 properties combined in one foil | (6) (a) Less inventory |

The terms "untreated" and "raw" are used herein to refer to a base foil that has not undergone subsequent treatment for the purpose of refining or enhancing the foil properties. The term "treated" is used herein to refer to raw or base foil that has undergone such treatment. This treatment is entirely conventional and typically involves the use of various treating and rinsing solutions. Either or both the matte side and the shiny side can be treated. In one embodiment, the raw or base foil has at least one roughened layer of copper or copper oxide applied to at least one side of the foil.

In one embodiment, the raw or base foil has at least one metallic or barrier layer applied to at least one side of the foil. The metal in this metallic layer is selected from the group consisting of indium, zinc, tin, nickel, cobalt, copper-zinc alloy, copper-fin alloy, and zinc-nickel alloy.

In one embodiment, the raw or base foil has at least one metallic or stabilization layer applied to at least one side of the foil. The metal in this metallic layer is selected from the group consisting of tin, chromium, chromium-zinc alloy, zinc and zinc-nickel alloy.

In one embodiment, the raw or base foil has at least one roughened layer of copper or copper oxide applied to at least one side of the foil, at least one first metallic or barrier layer applied to the roughened layer, the metal in the first metallic layer being selected from the group consisting of indium, zinc, tin, nickel, cobalt, copper-zinc alloy, copper-tin alloy and zinc-nickel alloy, and at least one second metallic or stabilization layer applied to the first metallic layer, the metal in the second metallic layer being selected from the group consisting of tin, chromium, chromium-zinc alloy, zinc and zinc-nickel alloy.

The inventive copper foils have a smooth or shiny (drum) side and a rough or matte (copper deposit growth front) side. These foils can be bonded to dielectric substrates to provide dimensional and structural stability thereto, and in this regard, it is preferred to bond the matte side of the electrodeposited foil to the substrate so that the shiny side of the foil faces outwardly from the laminate. Useful dielectric substrates may be prepared by impregnating woven glass reinforcement materials with partially cured resins, usually epoxy resins. These dielectric substrates are sometimes referred to as prepregs.

In preparing the laminates, it is useful for both the prepreg material and the electrodeposited copper foil to be provided in the form of long webs of material rolled up in rolls. The rolled materials are drawn off the rolls and cut into rectangular sheets. The rectangular sheets are then laid-up or assembled in stacks of assemblages. Each assemblage may comprise a prepreg sheet with a sheet of foil on either side thereof, and in each instance, the matte side of the copper foil sheet is positioned adjacent the prepreg so that the shiny sides of the sheets of foil face outwardly on each side of the assemblage.

The assemblage may be subjected to conventional laminating temperatures and pressures between the plates of laminating presses to prepare laminates comprising sandwiches of a sheet of prepreg between sheets of copper foil.

The prepregs may consist of a woven glass reinforcement fabric impregnated with a partially cured two-stage resin. By application of heat and pressure, the matte side of the copper foil is pressed tightly against the prepreg and the temperature to which the assemblage is subjected activates the resin to cause curing, that is crosslinking of the resin and thus tight bonding of the foil to the prepreg dielectric substrate. Generally speaking, the laminating operation will involve pressures in the range of from about 100 to about 750 psi, temperatures in the range of from about 160° C. to 235° C. and a laminating cycle of from about 40 minutes to about 2 hours. The finished laminate may then be utilized to prepare printed circuit boards (PCB).

A number of manufacturing methods are available for preparing PCBs from laminates. Additionally, there is a myriad of possible end use applications including radios, televisions, computers, etc., for the PCB's. These methods and end uses are known in the art.

The inventive process involves forming an electrolyte solution, flowing it between the anode and cathode of an electroforming cell, and depositing copper on the cathode. The electrolyte solution is formed by dissolving a copper feed stock, which is preferably copper shot, copper wire or recycled copper, in a sulfuric acid solution. The copper feedstock, sulfuric acid and water are preferably high purity grade materials. The electrolyte solution is preferably subjected to a purification or filtering process prior to entering the electroforming cell. When voltage is applied between the anode and cathode, electrodeposition of copper occurs at the cathode. The electric current is preferably direct current or alternating current with a direct current bias. The electrodeposited copper is removed from the cathode as a continuous thin web of foil as the cathode rotates. It can be collected in roll form. The rotating cathode preferably is in the form of a cylindrical mandrel. However, alternatively, the cathode can be in the form of a moving belt. Both of these designs are known in the art. In one embodiment, the cathode is a chromium plated stainless steel drum. The anode has a curved shape conforming to the curved shape of the cathode to provide a uniform gap between the anode and the cathode. This gap is preferably from about 0.2 to about 2 centimeters in length.

The velocity of the flow of the electrolyte solution through the gap between the anode and the cathode is preferably in the range of about 0.2 to about 5 meters per second, more preferably about 1 to about 3 meters per second. The electrolyte solution preferably has a free sulfuric acid concentration in the range of about 10 to about 300 grams per liter, preferably about 60 to about 150 grams per liter, more preferably about 70 to about 120 grams per liter. The temperature of the of the electrolyte solution in the electroforming cell is preferably in the range of about 25° C. to about 100° C., more preferably about 40° C. to about 60° C. The copper ion concentration (contained in $CuSO_4$) is preferably in the range of about 25 to about 125 grams per liter, more preferably from about 60 to about 125 grams per liter, more preferably about 90 to about 110 grams per liter. The current density is critical and is in the range of about 0.1 to about 5 amps per square centimeter, more preferably about 0.5 to about 3 amps per square centimeter, more preferably about 1.2 to about 1.8 amps per square centimeter.

The level of undesirable inorganics (other than chloride ions) in the electrolyte solution is preferably less than about 2 grams per liter, more preferably less than about 500 ppm. These inorganics include bromine, phosphates, arsenic, zinc, tin, and the like.

The free chloride ion concentration of the operating electrolyte solution is critical and is preferably zero but as a practical matter is preferably less than about 1 ppm, more preferably less than about 0.5 ppm. The chloride ion concentration can be less than about 0.3 ppm, and in one embodiment less than about 0.2 ppm, and in another embodiment less than about 0.1 ppm, and in still another embodiment less than about 0.06 ppm. The term "operating electrolyte solution" is used herein to refer to the electrolyte solution after it enters the operating electroforming cell. A method for measuring low concentrations of chloride ion in the electrolyte solution involves the use of nephelometry and a reagent which forms an insoluble precipitate with chloride ions. Using a nephelometer, the chloride ion content of the sample can be quantified at levels as low as 0.01 ppm.

It is critical that the electrolyte solution contain at least one organic additive or derivative thereof. The concentration of said organic additive or derivative, in one embodiment, is in the range of about 3 to about 100 ppm, and in one embodiment from about 5 to about 100 ppm, and in another embodiment from about 7 to about 100 ppm. The organic additive can be used at concentrations in the range of about 5 to about 80 ppm and in one embodiment about 7 to about 20 ppm. In one embodiment the organic additive is one or more gelatins. The gelatins that are useful herein are heterogeneous mixtures of water-soluble proteins derived from collagen. Animal glue is a preferred gelatin.

In one embodiment the organic additive is selected from the group consisting of saccharin, caffeine, molasses, guar gum, gum arabic, thiourea, the polyalkylene glycols (e.g., polyethylene glycol, polypropylene glycol, polyisopropylene glycol, etc.), dithiothreitol, amino acids (e.g., proline, hydroxyproline, cysteine, etc.), acrylamide, sulfopropyl disulfide, tetraethylthiuram disulfide, alkylene oxides (e.g., ethylene oxide, propylene oxide, etc.), the sulfonium alkane sulfonates, thiocarbamoyldisulfide, or derivatives or mixtures of two or more thereof.

In one embodiment of the invention a continuous electrodeposition process for making copper foil is provided. A flow sheet of this process is depicted in FIG. 1. The apparatus used with this process includes an electroforming cell 10 that includes anode 12, cathode 14, vessel 16 and electrolyte solution 18. Anode 12 is submerged in electrolyte solution 18, and cathode 14 is partially submerged in electrolyte solution 18.

Electrical means that are well known in the art are provided for applying a voltage between anode 12 and cathode 14. The current is preferably direct current or alternating current with a direct current bias. Copper ions in solution 18 gain electrons at the peripheral surface 14a of cathode 14 whereby metallic copper plates out in the form of a foil layer 20. Cathode 14 rotates continuously about its axis 14b during the process and foil layer 20 is continuously withdrawn from surface 14a as a continuous web which is formed into a roll 20a.

The process depletes the electrolyte solution of copper ions and organic additives. These ingredients are continuously replenished. Electrolyte solution 18 is withdrawn through line 22 and recirculated through filter 24, digester 26 and filter 28, and then is reintroduced into vessel 16 through line 30. Sulfuric acid from a source 32 is advanced to digester 26 through line 34. Copper from a source 36 is introduced into digester 26 along path 38. In one embodiment the metallic copper is in the form of copper shot, copper wire, copper oxide or recycled copper. The copper is dissolved by the sulfuric acid and air to form copper ions in digester 26.

Organic additives are added to the recirculating solution in line 22 from a source 40 through line 42 or through line 44 from a source 46. The addition rate for these organic additives is preferably in the range of about 0.1 to about 30 mg/min/kA, and in one embodiment from about 2 to about 20 mg/min/kA, and in another embodiment from about 4 to about 20 mg/min/kA, and in another embodiment from about 6 to about 20 mg/min/kA, and in another embodiment from about 8 to about 20 mg/min/kA.

Additional advantages of the invention include:

(1) Easier bath control: with chloride ion levels below about 1 ppm, bath control is easier. When chloride ions are present at higher levels, their concentration changes when the copper dissolution rate changes. At such higher levels chloride ions are continuously depleted by drag-out, plate-out, misting, etc., and therefore require constant monitoring and control.

(2) Longer drum and equipment life: chloride ions are known to attack and cause pitting and to accelerate corrosion of most metal surfaces. In the electroforming bath, chloride ions shorten the usable life of a drum surface and gradually corrode tanks, pipes, filters, etc. Also, organic additives such as animal glue tend to increase the usable lifetime of a drum. With the inventive process, drum surface lifetimes increase by about 150% or more.

(3) No porosity: when chloride ions are present at levels above about 1 ppm, a columnar grain structure is formed and the copper nucleation density is lessened. With chloride ion levels below about 1 ppm, a random grain growth occurs with grain sizes one to two orders of magnitude less than when chloride ions are present at higher concentrations. With chloride ion levels below about 1 ppm, the copper nucleation density is higher. Also, the use of organic additives such as animal glue tend to reduce porosity. While not wishing to be bound by theory, it is believed that it is the combination of these factors that provide for the production of the porosity free inventive copper foils.

(4) Fewer pits and dents: because of their superior and uniform metallurgical properties, including superior hardness characteristics, the inventive copper foils exhibit fewer pits and dents as a result of treatment, slitting and related handling operations than prior art foils.

The following example is provided for purposes of illustrating the invention. Unless otherwise indicated, in the following example as well as throughout the specification and claims, all parts and percentages are by weight, all temperatures are in degrees centigrade, and all pressures are atmospheric.

Example

Electrodeposition of the inventive copper foil and three comparative examples is carded out under the conditions indicated below. The inventive foil is identified as 1-A. The comparative examples are 1-B, 1-C and 1-D. For each foil the organic additive is animal glue. The operating conditions for each of these foils are essentially the same with the exception that for foil 1-A the electrolyte solution chloride level is almost zero (i.e., 0.03-0.05 ppm) and the addition rate for the animal glue (i.e., 9 mg/min/kA) is relatively high.

| Parameter | 1-A | 1-B | 1-C | 1-D |
| --- | --- | --- | --- | --- |
| $Cu^{+2}$ in $CuSO_4$ (g/l) | 93 | 100 | 100 | 100 |
| Free sulfuric acid (g/l) | 80 | 80 | 80 | 80 |
| Free chloride ion (ppm) | 0.03-0.05 | 70-90 | 70-90 | 2-5 |
| Temperature (°C.) | 54.4 | 60 | 58 | 57 |
| Current Density (A/cm$^2$) | 1.51 | 1.44 | 1.51 | 1.0 |
| Organic Additive addition rate (mg/min/kA) | 9 | 4 | 0.4 | 2.1 |
| Flow velocity (m/s) | 2 | 2 | 2 | 2 |

The metallurgical properties for these foils are as follows:

| Parameter | 1-A | 1-B | 1-C | 1-D |
| --- | --- | --- | --- | --- |
| UTS @ 23° C. (psi) | 100,000 | 55,000 | 60,000 | 60,000 |
| Elongation @ 23° C. (%) | 8 | 11 | 18 | 16 |
| UTS @ 180° AC. (psi) | 29,000 | 29,000 | 33,000 | 30,000 |
| Elongation @ 180° C. (%) | 23 | 2 | 7 | 9 |
| Hardness (KHN) @ 23° C. | 220 | 110 | 130 | 140 |

Figure 2:
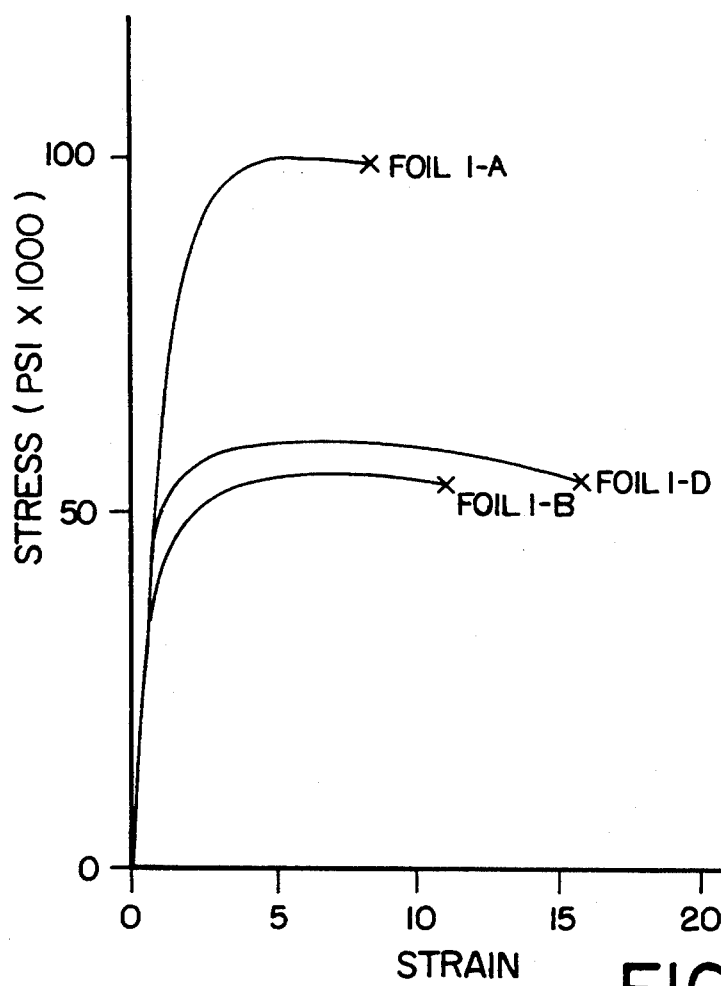
FIG. 2 is a plot of the stress-strain curves for Foils 1-A, 1-B and 1-D from the Example.

The stress-strain curves at 23° C. for foils 1-A, 1-B and 1-D are plotted in FIG. 2. These curves show the UTS for each of these foils and clearly demonstrate the superiority of foil 1-A over the other foils.

Figure 3:
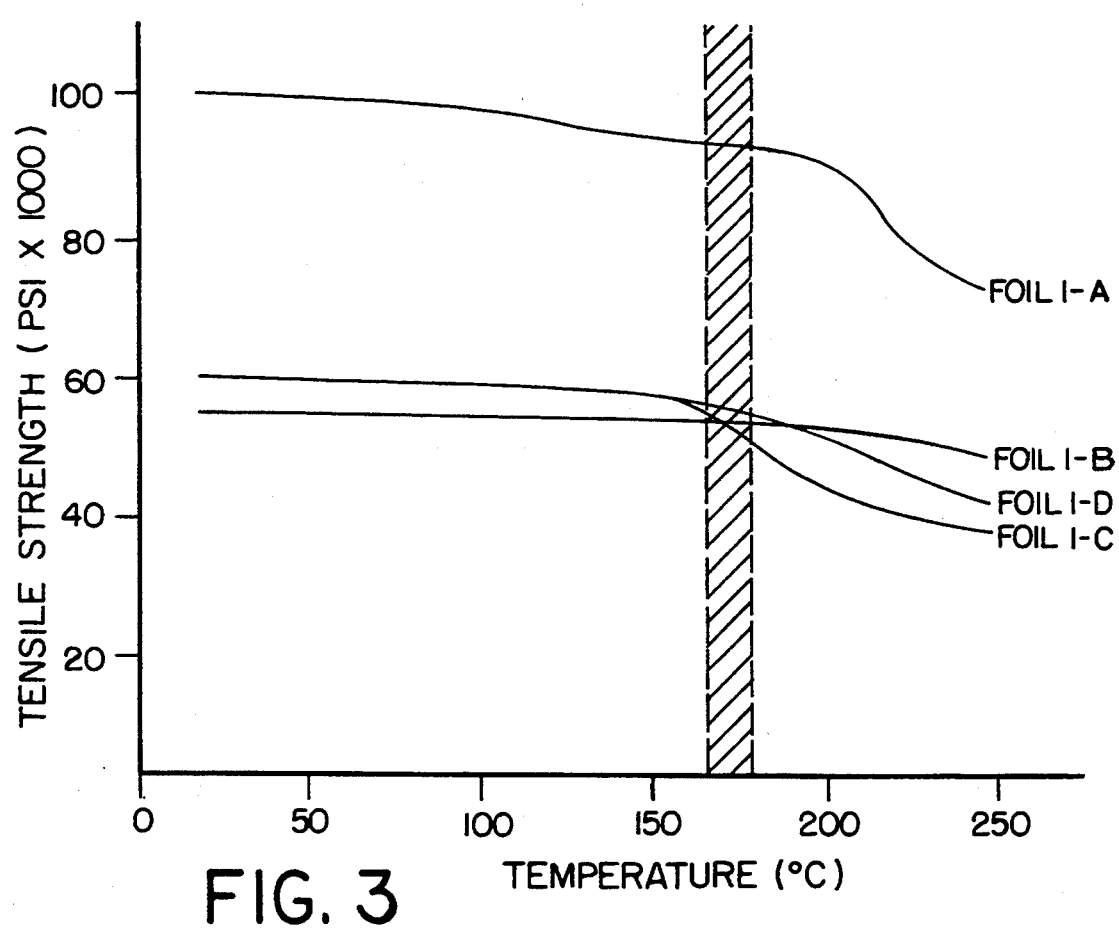
FIG. 3 is a plot of the thermal stability curves for Foils 1-A, 1-B, 1-C and 1-D from the Example.

The thermal stability curves for foils 1-A to 1-D are plotted in FIG. 3. These curves represent a plot of the UTS at 23° C. for the foil after it is annealed at the indicated temperature for 30 minutes in an oil bath. The shaded temperature region is the lamination temperature region most often used by laminators. The plot for foil 1-A shows a loss in UTS of only about 8% when the foil is annealed at 200° C.

FIGS. 4A to 4D are photomicrographs taken at a magnification of 1600 × of cross-sections of copper foils 1-A to 1-D as indicated below. Similarly, FIGS.

5A to 5D are TEM images of these foils taken at a magnification of 19,000 × as indicated below.

Figure 4A:
FIG. 4A is a photomicrograph taken at a magnification of 1600 × of the cross-section of Foil 1-A from the Example.
Figure 4B:
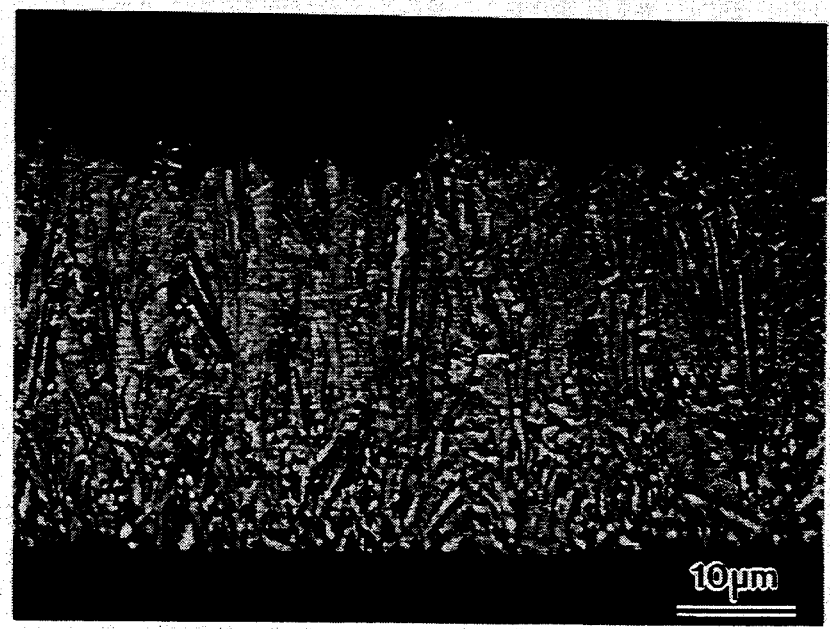
FIG. 4B is a photomicrograph taken at a magnification of 1600 × of the cross-section of Foil 1-B from the Example.
Figure 4C:
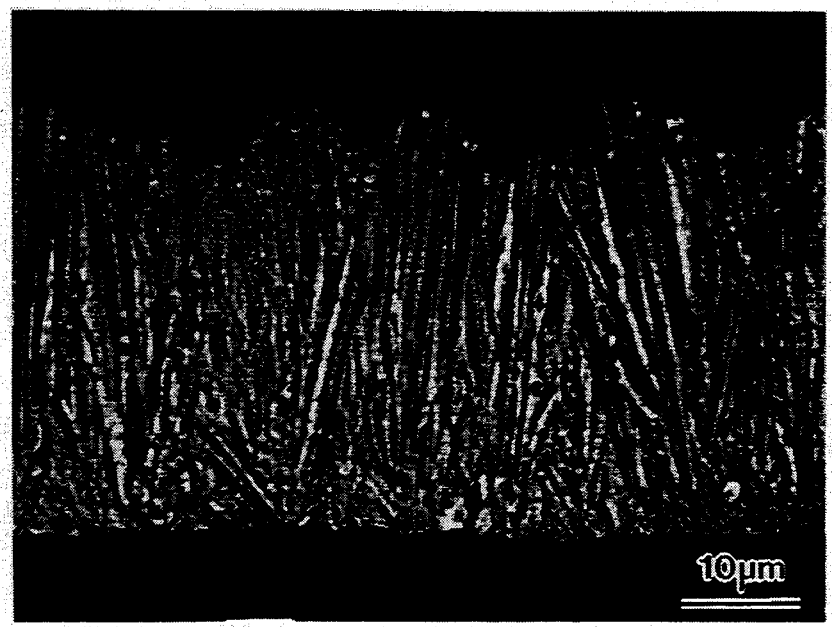
FIG. 4C is a photomicrograph taken at a magnification of 1600 × of the cross-section of Foil 1-C from the Example.
Figure 4D:
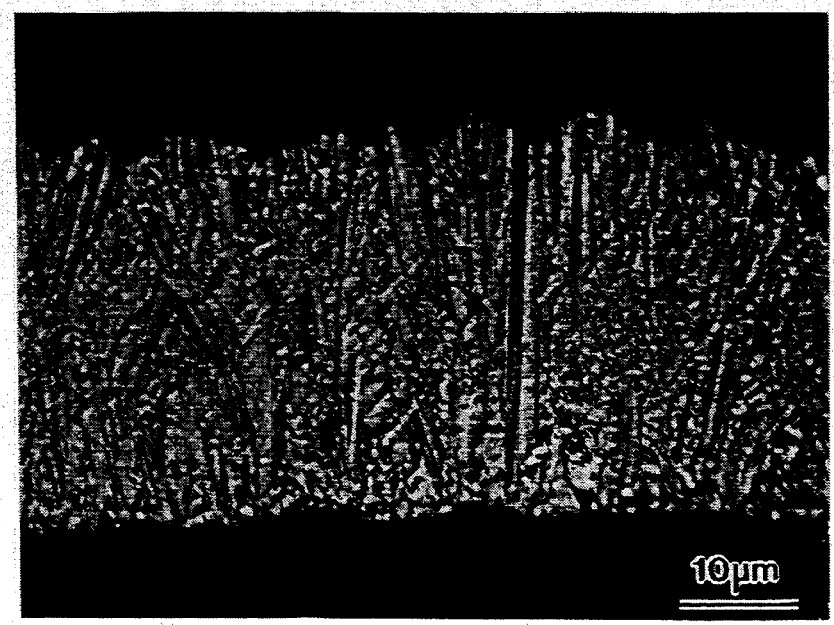
FIG. 4D is a photomicrograph taken at a magnification of 1600 × of the cross-section of Foil 1-D from the Example.
Figure 5A:
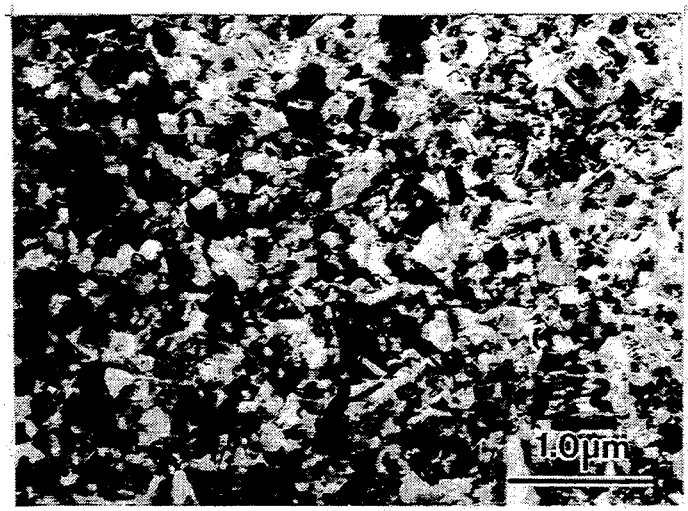
FIG. 5A is a transmission election microscopy (TEM) image taken at a magnification of 19,000 × of the cross-section of Foil 1-A from the Example.
Figure 5B:
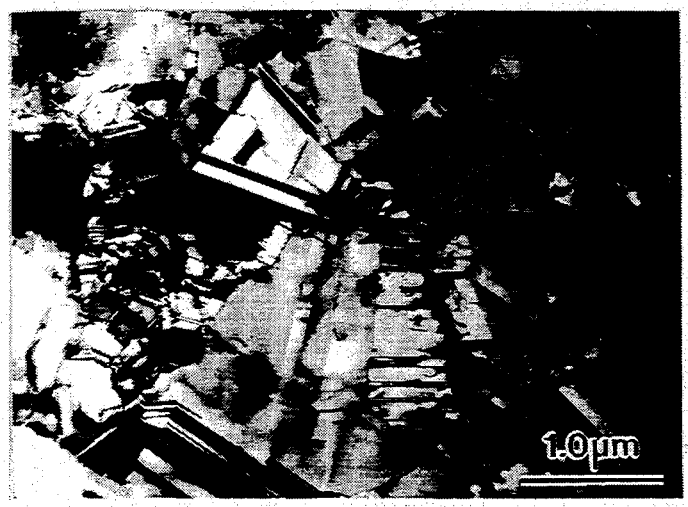
FIG. 5B is a TEM image taken at a magnification of 19,000 × of the cross-section of Foil 1-B from the Example.
Figure 5C:
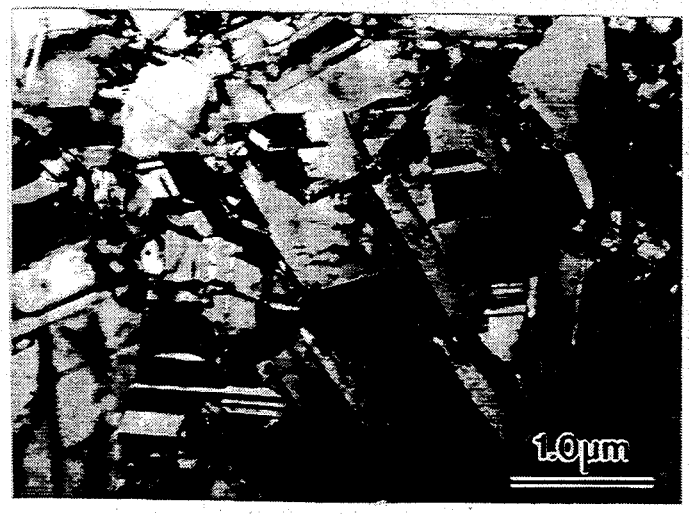
FIG. 5C is a TEM image taken at a magnification of 19,000 × of the cross-section of Foil 1-C from the Example.
Figure 5D:
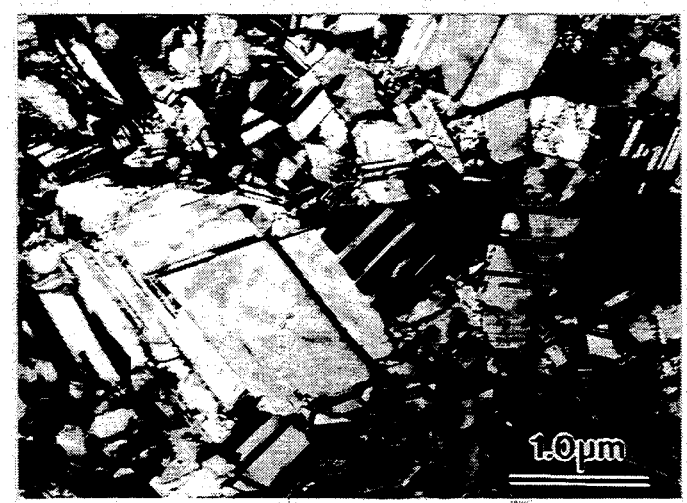
FIG. 5D is a TEM image taken at a magnification of 19,000 × of the cross-section of Foil 1-D from the Example.
Figure 6:
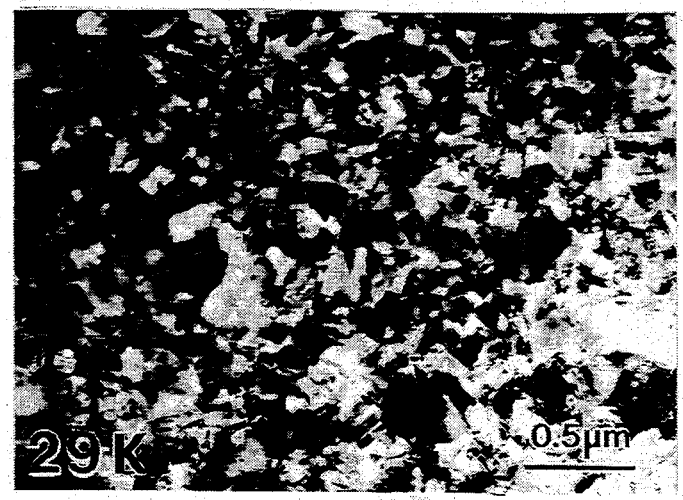
FIG. 6 is a TEM image taken at a magnification of 29,000 × of the cross-section of Foil 1-A from the Example.
Figure 7:
FIG. 7 is a TEM image taken at a magnification of 58,000 × of the cross-section of Foil 1-A from the Example.
Figure 8:
FIG. 8 is a TEM image taken at a magnification of 72,000 × of the cross-section of Foil 1-A from the Example.
Figure 9:
FIG. 9 is a TEM image taken at a magnification of 100,000 × of the cross-section of Foil 1-A from the Example.

| Foil | 1600 X | 19,000 X |
|------|--------|----------|
| 1-A  | FIG. 4A | FIG. 5A |
| 1-B  | FIG. 4B | FIG. 5B |
| 1-C  | FIG. 4C | FIG. 5C |
| 1-D  | FIG. 4D | FIG. 5D |

FIGS. 4A and 5A disclose a non-porous uniform randomly oriented grain structure for foil 1-A that is columnar grain free and twin boundary free. This photomicrograph (FIG. 4A) and TEM image (FIG. 5A) indicate that the average grain size of this foil is less than 1 micron. FIG. 4B-4D and 5B-5D, on the other hand, indicate a columnar grain structure and the formation of twin boundaries. FIGS. 4B-4D and 5B-5D also show a non-random grain growth and grain sizes of at least one to two orders larger than those shown in FIGS. 4A and 5A.

FIGS. 6 to 9 are TEM images of foil 1-A at the following magnifications:

| FIG. | Magnification |
|------|---------------|
| 6    | 29,000        |
| 7    | 58,000        |
| 8    | 72,000        |
| 9    | 100,000       |

These TEM images further demonstrate the fact that foil 1-A has a non-porous randomly oriented grain structure that is columnar grain free and twin boundary free. They also demonstrate that the average grain size for this foil is less than 1 micron.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

We claim:

1. A controlled low profile electrodeposited copper foil having a substantially uniform randomly oriented grain structure that is essentially columnar grain free and twin boundary free and has an average grain size of up to about 10 microns.

2. The foil of claim 1 wherein said foil has an ultimate tensile strength at 23° C. is in the range of about 87,000 to about 120,000 psi.

3. The foil of claim 1 wherein said foil has an elongation measured at 23° C. is in the range of about 4% to about 12%.

4. The foil of claim 1 wherein said foil has an ultimate tensile strength at 180° C. is in the range of about 25,000 to about 35,000 psi.

5. The foil of claim 1 wherein said foil has an elongation measured at 180° C. in the range of about 15% to about 28%.

6. The foil of claim 1 wherein said foil has a Knoop Hardness Number in the range of about 160 to about 240.

7. The foil of claim 1 wherein the average grain size is up to about 1 micron.

8. The foil of claim 1 wherein said foil is both an IPC Class 1 and Class 3 foil.

9. The foil of claim 1 wherein said foil has a thermal stability of less than about 15%.

10. The foil of claim 1 wherein the matte side raw foil $R_{tm}$ for said foil is in the range of about 1 to about 10 microns.

11. The foil of claim 1 wherein the shiny side raw foil $R_{tm}$ for said foil is less than about 6 microns.

12. The foil of claim 1 further having at least one roughened layer of copper or copper oxide applied to at least one side of said foil.

13. The foil of claim 1 further having at least one metallic layer applied to at least one side of said foil, the metal in said metallic layer being selected from the group consisting of indium, zinc, tin, nickel, cobalt, copper-zinc alloy, copper-tin alloy, and zinc-nickel alloy.

14. The foil of claim 1 further having at least one metallic layer applied to at least one side of said foil, the metal in said metallic layer being selected from the group consisting of chromium, chromium-zinc alloy, zinc and zinc-nickel alloy.

15. The foil of claim 1 further having at least one roughened layer of copper or copper oxide applied to at least one side of said foil, at least one first metallic layer applied to said roughened layer, the metal in said first metallic layer being selected from the group consisting of indium, zinc, tin, nickel, cobalt, copper-zinc alloy, copper-tin alloy and zinc-nickel alloy, and at least one second metallic layer applied to said first metallic layer, the metal in said second metallic layer being selected from the group consisting of tin, chromium, chromium-zinc alloy, zinc and zinc-nickel alloy.

16. A controlled low profile electrodeposited copper foil having an ultimate tensile strength measured at 23° C. in the range of about 87,000 to about 120,000 psi and an elongation measured at 180° C. of about 15% to about 28%.

17. The foil of claim 16 wherein said foil has a substantially uniform randomly oriented grain structure that is essentially columnar grain free and twin boundary free and has an average grain size of up to about 1 micron.

18. The foil of claim 16 wherein said foil has an ultimate tensile strength at 23° C. in the range of about 95,000 to about 120,000 psi.

19. The foil of claim 16 wherein said foil has an elongation measured at 23° C. in the range of about 4% to about 12%.

20. The foil of claim 16 wherein said foil has an ultimate tensile strength at 180° C. in the range of about 25,000 to about 35,000 psi.

21. The foil of claim 16 said foil has an elongation measured at 180° C. in the range of about 18% to about 25%.

22. The foil of claim 16 wherein said foil has a Knoop Hardenss Number in the range of about 160 to about 240.

23. The foil of claim 16 wherein the average grain size is in the range of about 0.1 to about 0.5 micron.

24. The foil of claim 16 wherein said foil is both an IPC Class 1 and Class 3 foil.

25. The foil of claim 16 wherein said foil has a thermal stability of less than about 15%.

26. The foil of claim 16 wherein the matte side raw foil $R_{tm}$ for said foil is in the range of about 1 to about 10 microns.

27. The foil of claim 16 wherein the shiny side raw foil $R_{tm}$ for said foil is less than about 6 microns.

28. The foil of claim 16 further having at least one roughened layer of copper or copper oxide applied to at least one side of said foil.

29. The foil of claim 16 further having at least one metallic layer applied to at least one side of said foil, the metal in said metallic layer being selected from the group consisting of indium, zinc, tin, nickel, cobalt, copper-zinc alloy, copper-tin alloy, and zinc-nickel alloy.

30. The foil of claim 16 further having at least one metallic layer applied to at least one side of said foil, the metal in said metallic layer being selected from the group consisting of chromium, chromium-zinc alloy, zinc and zinc-nickel alloy.

31. The foil of claim 16 further having at least one roughened layer of copper or copper oxide applied to at least one side of said foil, at least one first metallic layer applied to said roughened layer, the metal in said first metallic layer being selected from the group consisting of indium, zinc, tin, nickel, cobalt, copper-zinc alloy, copper-tin alloy and zinc-nickel alloy, and at least one second metallic layer applied to said first metallic layer, the metal in said second metallic layer being selected from the group consisting of tin, chromium, chromium-zinc alloy, zinc and zinc-nickel alloy.

32. A controlled low profile electrodeposited copper foil having an ultimate tensile strength measured at 23° C. in the range of about 87,000 to about 120,000 psi, an elongation measured at 180° C. of about 15% to about 28%, and a substantially uniform randomly oriented grain structure that is essentially columnar grain free and twin boundary free and has an average grain size of up to about 1 micron.

33. A laminate comprising at least one layer of copper adhered to a dielectric substrate, said copper layer comprising the foil of claim 1.

34. A laminate comprising at least one layer of copper adhered to a dielectric substrate, said copper layer comprising the foil of claim 16.

35. A process for making electrodeposited copper foil comprising:
  (A) flowing an electrolyte solution between an anode and a rotating cathode, applying an effective amount of voltage across said anode and said cathode to provide an effective current between said anode and said cathode having a current density in the range of about 0.1 to about 5 A/cm$^2$, and depositing copper on said cathode; said electrolyte solution comprising copper ions, sulfate ions, chloride ions at a concentration of about 0.01 to about 1 ppm and at least one organic additive or derivative thereof; and
  (B) removing deposited copper from said cathode as a continuous thin web of copper foil; wherein said copper foil has an ultimate tensile strength measured at 23° C. in the range of about 87,000 to about 120,000 psi, an elongation measured at 180° C. of about 15% to about 28%, and a substantially uniform randomly oriented grain structure that is essentially columnar grain free and twin boundary free and has an average grain size of up to about 10 microns.

36. The process of claim 35 wherein said organic additive is at least one gelatin.

37. The process of claim 35 wherein said organic additive is animal glue.

38. The process of claim 35 wherein said organic additive is selected from the group consisting of thiourea, saccharin, caffeine, molasses, guar gum, gum arabic, polyethylene glycol, polypropylene glycol, polyisopropylene glycol, dithiothreitol, proline, hydroxyproline, cysteine, acrylamide, sulfopropyl disulfide, tetraethylthiuram disulfide, ethylene oxide, propylene oxide, sulfonium alkane sulfonate, thiocarbamoyldisulfide, and mixtures of two or more thereof.

39. The process of claim 35 wherein said electrolyte solution has a copper ion concentration in the range of about 25 to about 125 grams per liter, a free sulfuric acid concentration in the range of about 10 to about 300 grams per liter, the current density is from about 1.2 to about 1.8 A/cm$^2$, the temperature of said electrolyte solution is about 25° C. to about 100° C., and the flow velocity of electrolyte solution between said anode and said cathode is from about 0.2 to about 5 meters per second.

40. The process of claim 35 further comprising the step of applying to at least one side of said foil at least one roughened layer of copper or copper oxide.

41. The process of claim 35 further comprising the step of applying to at least one side of said foil at least one metallic layer, the metal in said metallic layer being selected from the group consisting of indium, zinc, tin, nickel, cobalt, copper-zinc alloy, copper-tin alloy, and zinc-nickel alloy.

42. The process of claim 35 further comprising the step of applying to at least one side of said foil at least one metallic layer, the metal in said metallic layer being selected from the group consisting of chromium, chromium-zinc alloy, zinc and zinc-nickel alloy.

43. The process of claim 35 further comprising the steps of applying to at least one side of said foil at least one roughened layer of copper or copper oxide, then applying to said roughened layer at least one first metallic layer, the metal in said first metallic layer being selected from the group consisting of indium, zinc, tin, nickel, cobalt, copper-zinc alloy, copper-tin alloy and zinc-nickel alloy, then applying to said first metallic layer at least one second metallic layer, the metal in said second metallic layer being selected from the group consisting of tin, chromium, chromium-zinc alloy, zinc and zinc-nickel alloy.

44. A process for making a copper foil comprising:
  (A) flowing an electrolyte solution between an anode and a rotating cathode, applying an effective amount of voltage across said anode and said cathode to provide an electric current between said anode and cathode having a current density in the range of about 1.2 to about 1.8 A/cm$^2$, and depositing copper on said cathode; said electrolyte solution comprising copper ions, sulfate ions, chloride ions at a concentration of about 0.01 to about 0.5 ppm, and animal glue or a derivative thereof;
  (B) removing deposited copper from said cathode as a continuous thin web of copper foil; wherein said copper foil has an ultimate tensile strength measured at 23° C. in the range of about 87,000 to about 120,000 psi, an elongation measured at 180° C. of about 15% to about 28%, and a substantially uniform randomly oriented grain structure that is essentially columnar grain free and twin boundary free and has an average grain size of up to about 10 microns; and
  (C) adding animal glue to said electrolyte solution, the rate at which said animal glue is added being about 0.1 to about 30 mg/min/kA.

* * * * *